United States Patent [19]

Mardis

[11] Patent Number: 5,000,079
[45] Date of Patent: Mar. 19, 1991

[54] NOISE-ATTENUATING VENTILATION PEDESTAL FOR AN ELECTRONIC ENCLOSURE

[76] Inventor: Michael C. Mardis, P.O. Box 2626, Lincoln, Nebr. 68502-0626

[21] Appl. No.: 525,122

[22] Filed: May 17, 1990

[51] Int. Cl.⁵ .............................................. H05K 7/20
[52] U.S. Cl. .................................. 98/1; 98/DIG. 10; 361/384
[58] Field of Search ............... 98/1, DIG. 10; 165/47, 165/121; 361/384

[56] References Cited

U.S. PATENT DOCUMENTS

| | | | |
|---|---|---|---|
| 3,467,892 | 9/1969 | Sprude et al. | 361/384 X |
| 3,511,337 | 5/1970 | Pease et al. | 181/52 |
| 3,779,341 | 12/1973 | Huggins | 181/50 |
| 3,820,628 | 6/1974 | Hanson | 181/33 |
| 3,903,404 | 9/1975 | Beall et al. | 361/384 X |
| 4,049,074 | 9/1977 | Kazin | 181/286 |
| 4,109,754 | 8/1978 | Purhonen | 181/252 |
| 4,132,159 | 2/1979 | Dellrud et al. | 98/42 |
| 4,164,265 | 8/1979 | Kucharczyk | 181/224 |
| 4,212,369 | 5/1980 | Zeilinger | 181/224 |
| 4,330,047 | 5/1982 | Ruspa et al. | 181/224 |
| 4,359,085 | 11/1982 | Mueller | 165/47 |
| 4,449,764 | 5/1984 | Hastings | 312/236 |
| 4,589,712 | 5/1986 | Hastings | 312/236 |
| 4,600,249 | 7/1986 | Anderson | 312/196 |
| 4,643,245 | 2/1987 | Smout, III et al. | 361/384 X |
| 4,660,676 | 4/1987 | Eustace | 181/224 |
| 4,728,160 | 3/1988 | Mondor et al. | 312/236 |

OTHER PUBLICATIONS

DeSilva, D. K. et al., "Low Noise Air Moving Chamber for an Electronic Apparatus Enclosure", *IBM Technical Disclosure Bulletin*, IBM Corporation, vol. 20, No. 4, p. 1336, Sep. 1977.

*Primary Examiner*—Harold Joyce
*Attorney, Agent, or Firm*—Zarley, McKee, Thomte, Voorhees & Sease

[57] ABSTRACT

A pedestal which is open to the floor with provision for an air gap between the top of the pedestal and the electronic enclosure positioned thereabove. A plurality of air movers are mounted to the base of the enclosure and penetrate the pedestal. Air is drawn inwardly through the gap between the pedestal and the bottom of the enclosure and pumped into the enclosure through an opening in the bottom thereof. Noise from the fan inlet is constrained by a rubber bell and absorbed by the flooring materials. Direct transmission of inlet noise is blocked by the pedestal walls. Exhaust noise is constrained by a rubber nozzle and cone. The invention allows for a large volume of filtered air to pass through the enclosure with a minimum of incurred noise.

12 Claims, 3 Drawing Sheets

NOISE-ATTENUATING VENTILATION PEDESTAL FOR AN ELECTRONIC ENCLOSURE

BACKGROUND OF THE INVENTION

This invention relates to a ventilation device for an electronic enclosure and more particularly, to a noise-attenuating ventilation pedestal for an electronic enclosure which is adapted for use as a simple adjunct to floor-standing enclosure designs.

The reliability of all electronic devices is influenced by their operating temperatures. If the electronic device is operated below a certain temperature, it will not function properly. If the electronic device is operated above a certain temperature, it will fail permanently. The temperature at which such failure occurs decreases with time as the device is aged by operational stresses. If the device can be operated below all critical temperatures, voltages and currents, then it should be able to operate indefinitely. The higher the device is operated above these critical levels, the sooner the device will fail.

Several methodologies have been employed to reduce the operational temperatures of electronic devices. Such devices may be designed to reduce the amount of heat generated in the performance of a particular task. The device may incorporate heat sinks to enhance the ability of the device to dissipate heat. A number of devices may be arranged in a manner in which the generated heat establishes natural convection currents which may be employed to draw in cool air at the base of the enclosure and to exhaust warmer air above. The device may be placed in an actively ventilated enclosure wherein an air moving device is employed to either pump ambient air into or draw heated air out of the enclosure. The device may be actively cooled by refrigeration equipment to reduce the operational temperature below the otherwise available ambient temperature. These methods can be and are employed in various combinations.

Another source of reliability problems with electronic devices is that of contamination by foreign materials or objects. Dust, typically, accumulates near any edge or other flow stagnation points. These particulates can seriously impair the function and life of removable storage media and their interfacing devices. The dust accumulation also reduces the effective air flow near the electronic device, thus impairing its capacity for heat dissipation and thus its reliability. Increased ventilation of an electronic device can lead to increased dust accumulation upon its surfaces. One means of reducing such dust accumulation is by air filtration. Unfortunately, most manufacturers employ suction wholly or partially to move air through their enclosures. Filtration of the input air is difficult, if not impossible, under such a scheme as particulate laden air is drawn in through any and all penetrations of the enclosure.

A common design problem encountered in the design of filtered ventilation for an electronic device is that of access to the filtration media, since particulates accumulate in the media as the enclosure is ventilated. Eventually, due to clogging of the filtration media, the pressure drop across the media becomes so great that the flow through the air moving device becomes ineffective. Further, an air mover generates its own heat, thus creating a situation where the electronics are subjected to higher thermal stress with ventilation than without. The enclosure designer must therefore make the filtration system readily accessible for servicing or replacement.

In industrial environments, electronic device failure can be very costly due to line stoppage. Reliability of the electronic device is of prime importance. The noise generated by increased ventilation is minimal with respect to that generated by common industrial operations. Thus, industrial electronic devices are often highly ventilated with filtered air.

In office environments, thermal stresses and airborne particulates are not as prevalent as in industrial environments. However, noise reduction is a major concern. A noisy device will not be purchased if there is a quieter alternative available. Competition motivates manufacturers to provide quiet devices wherein the minimal amount of ventilation required for the typical environment is employed. Unfortunately, office environments vary widely. Device reliability can range from a few months to a few years under such conditions with marginal ventilation. Although technically obsolete, a device can have a useful life, from the customer's viewpoint, of many years. Increased ventilation can easily extend the reliable lifetime of a device beyond the time at which the device is replaced by new technology. A device that operates reliably throughout its useful life should be very desirable.

The means conventionally used to reduce the noise generated by ventilation involve the reduction of ventilation capacity. Low speed fans generate less noise but inherently less flow. Fans are placed internally to isolate the noise. With such placement, there is likely to be an internal recirculation component reducing the effective fresh air exchange. Exhaust ports are placed at the rear of the enclosure to limit forward propagation of noise. Little attention is paid to the noise generation characteristics of the air mover. Air movers are standardized components. The manufacturers of these air movers have made some progress in terms of airfoil design and turbulence minimization to reduce the generated noise. However, electronic device manufacturers simply add these air movers to their devices without modification. The interface between the air movers and their surroundings has been largely ignored.

Due to established standards, an electronic system can be built by simply assembling a collection of minimally compatible components. Standards describe primarily logical, electrical and physical interconnection. They rarely address thermal and electromagnetic compatibility. Inadequate attention to reliability issues is common. Reliability can be enhanced by utilization of power supplies and cooling apparatus of capacities well above minimal requirements. In the office environment, reliability through increased ventilation is compromised by the desire to minimize the resultant noise levels.

SUMMARY OF THE INVENTION

A noise-attenuating ventilation pedestal for an electronics enclosure is described for increasing air flow through the enclosure with little or no additional noise. The enclosure is wholly pressurized by fans attached to its base. The invention incorporates several means of reducing the noise generated by the fans. Air flow is directed at the inlet and exhaust in order to reduce turbulence in the air stream. Large diameter fans with lower rates of revolution are recommended in order to lower the energy and frequencies produced by the shearing of the air stream. Direct acoustic emissions are blocked as much as possible. Any generated noise is attenuated by retro-reflective surfaces in combination with sound absorbent materials. Very little noise is allowed to escape through the air intake.

Optional air filtration is provided for by a feature at a fan's inlet whereby filtration media may be trapped between the inlet bell and the fan guard. The elastic attachment of the bell to the ring insures that there are no alternate air intake paths except through the filter.

The invention consists of a pedestal open to the floor with provision for an air gap between the top of the pedestal and the computer enclosure above. Several air movers mounted to the base of the enclosure penetrate the pedestal. Air is drawn in through the gap and pumped into the enclosure. Air should be exhausted predominantly at the top of the enclosure and specifically near components with greater cooling requirements.

It is therefore a principal object of the invention to provide an improved noise-attenuating ventilation pedestal for an electronics enclosure.

It is a further object of the invention to provide a device of the type described above which is a simple adjunct to floor-standing enclosure design.

Yet another object of the invention is to provide a ventilation pedestal for an electronics enclosure which provides for increased reliability through increased ventilation while minimizing the incurred fan noise.

Still another object of the invention is to provide a noise-attenuating ventilation pedestal for an electronics enclosure having a minimum number of non-standard parts.

Yet another object of the invention is to provide a noise-attenuating ventilation pedestal for an electronics enclosure which is durable in use, refined in appearance and economical of manufacture.

These and other objects of the present invention will be apparent to those skilled in the art.

DESCRIPTION OF THE PREFERRED EMBODIMENT

Figure 1:
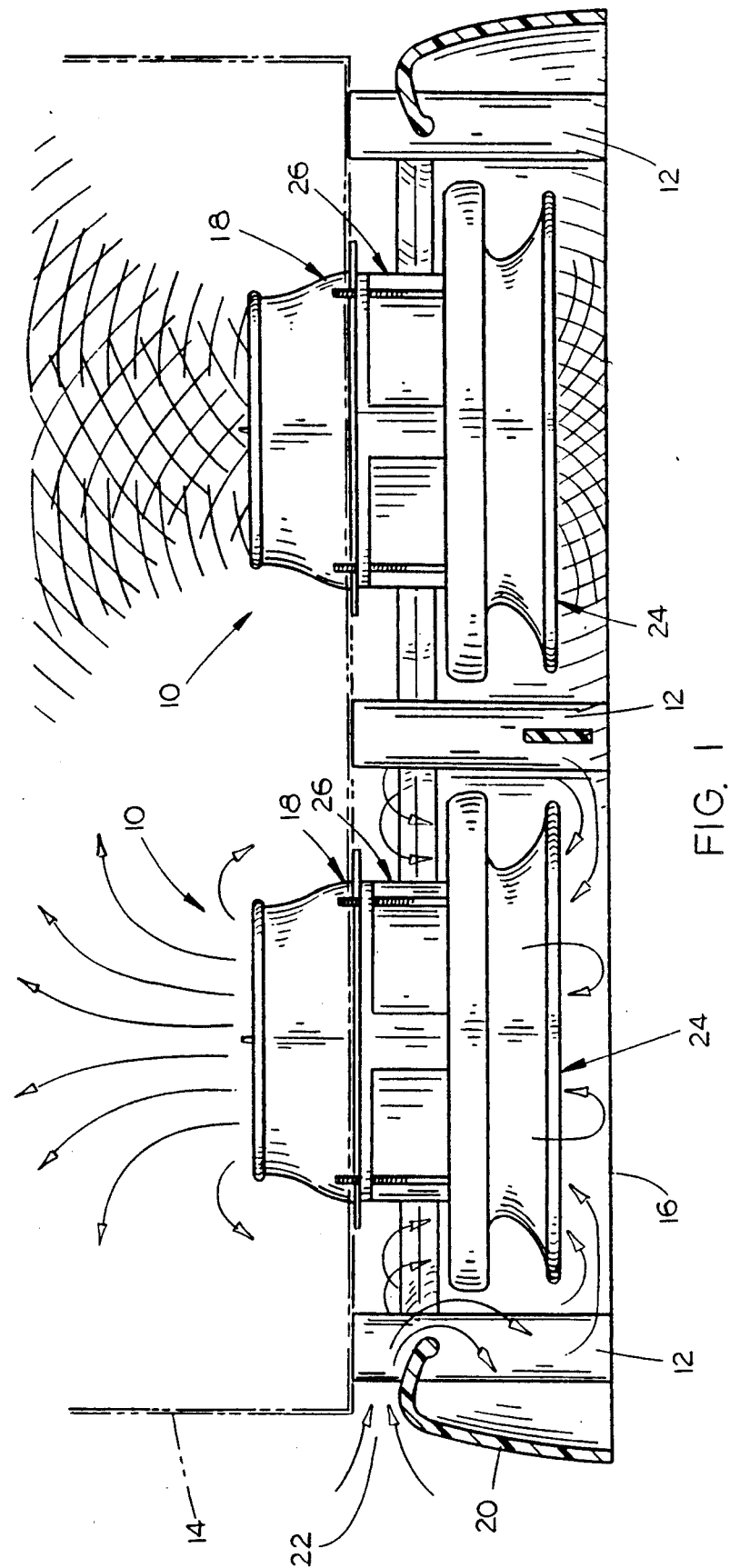
FIG. 1 is a vertical, sectional view of the pedestal of this invention mounted on the underside of an electronic enclosure.
Figure 2:
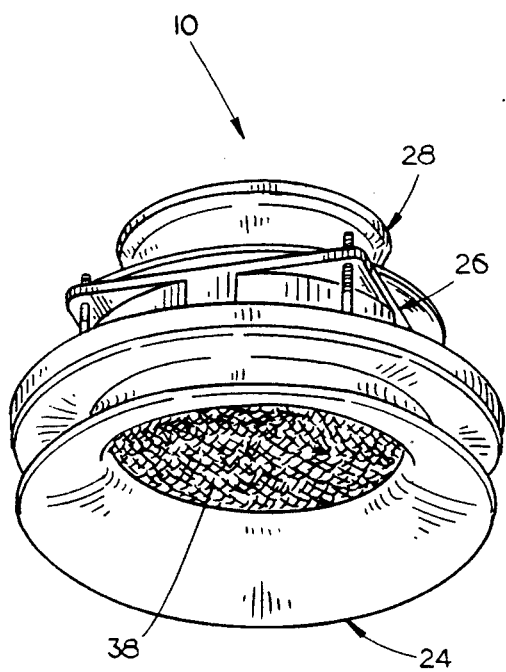
FIG. 2 is a bottom perspective view of the pedestal of this invention.

Referring now to FIG. 1, the pedestal of this invention is referred to generally by the reference numeral 10 and is comprised of a one-piece, molded part including legs 12 to elevate the electronics enclosure 14 to a sufficient height so as to provide clearance between the floor 16 and the air-movers 18. Although a pair of the air-movers 18 are illustrated in the drawings, any number of air-movers 18 may be utilized.

Figure 3:
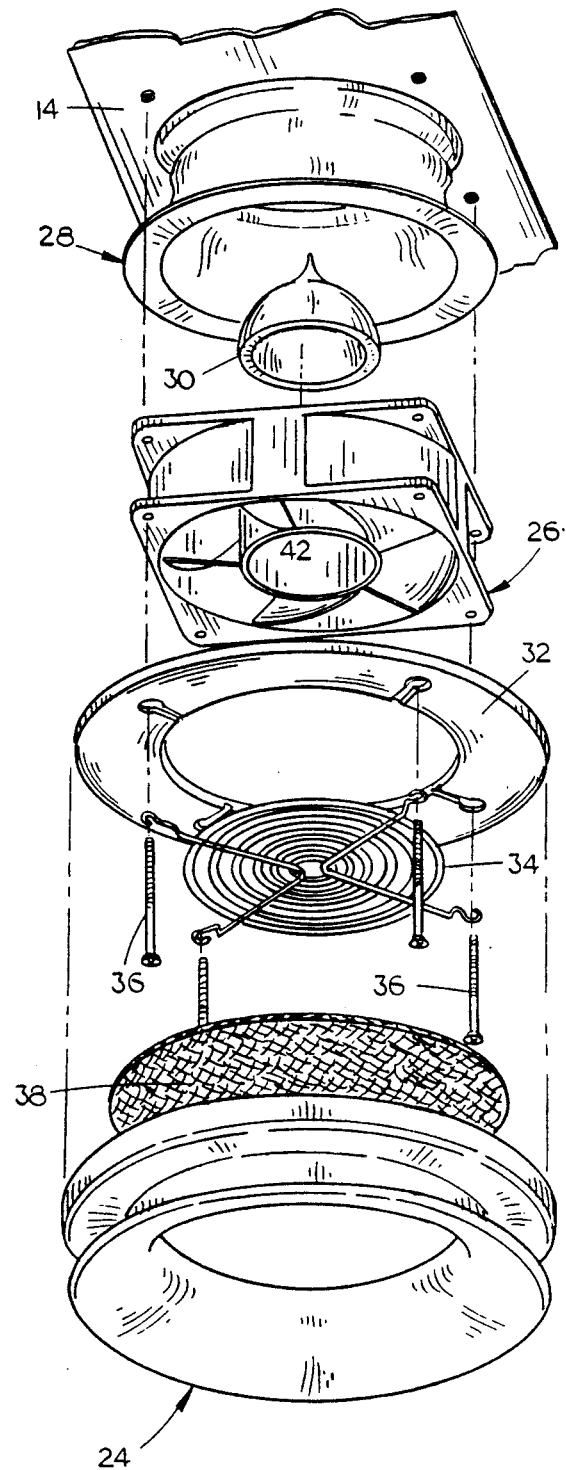
FIG. 3 is a bottom exploded perspective view of the pedestal of this invention.
Figure 4:
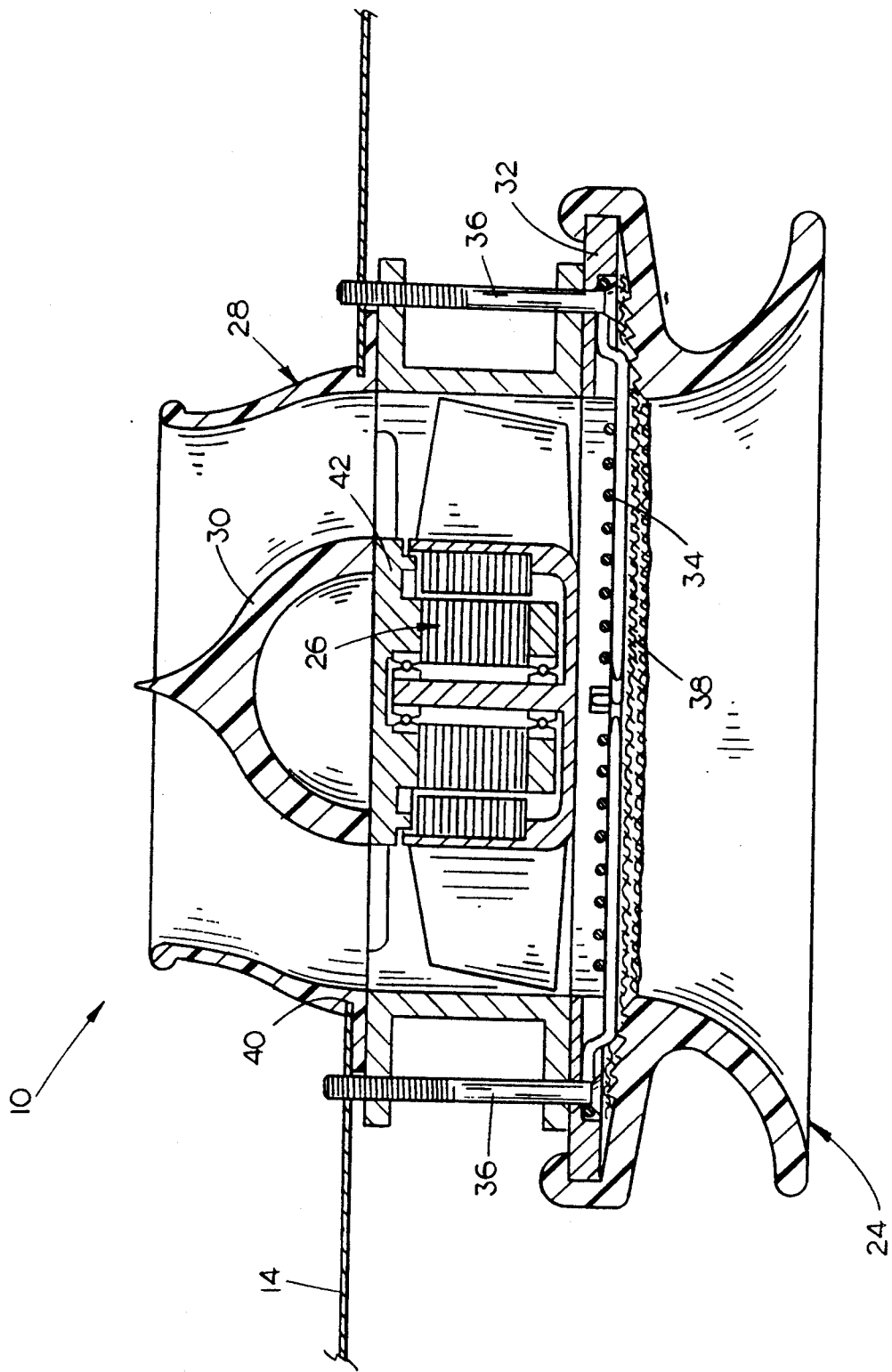
FIG. 4 is a sectional view of the pedestal of this invention.

The pedestal 10 includes an inwardly curved wall 20 which extends therearound designed to reflect any stray acoustical emissions downwardly into the sound-absorptive materials. As seen in the drawings, a gap 22 is provided which is positioned between the upper end of the wall 20 and the base of the enclosure 14 and is the only source of air intake. Gap 22 must be of sufficient height so as to prevent excessive air velocity therethrough which would generate turbulence and accordingly noise. Sharp edges are to be avoided near the gap for turbulence reduction. The air-movers 18 must be elevated to a height sufficient (with allowance for carpeting) to have a larger cross-flow area between the carpet and the base of the bell portion 24 of air-mover 18 than that through the fan 26 so as to avoid an abrupt pressure drop across this region with a subsequent loss of air flow. The air-mover 18 consists of a rubber exhaust nozzle 28, rubber exhaust cone 30, standard "box" fan 26, mounting ring 32, standard fan guard 34, screws 36, optional air filter 38, and the rubber inlet bell 24. As seen in the drawings, nozzle 28 snaps into an opening 40 formed in enclosure 14 and also serves as a gasket between the enclosure 14 and the fan 26. Cone 30 is bonded to the motor 42 of fan 26 as best seen in FIG. 3. The various components of the invention are secured to the enclosure by the screws 36 as illustrated in FIG. 4. As stated, a piece of filtration material 38 may be placed on the lip of the inlet bell 24 which then snaps over the edge of the ring 32.

Referring now to FIG. 3, the shape of the exhaust nozzle 28 and cone 30 are designed to provide constant or gradually increasing cross-flow area. A lip 44 is added to the outlet of the nozzle 28 to increase rigidity and mitigate resonant oscillations at low frequencies. For specific noise absorption, holes may be created in the walls of the cone 30 so as to form resonators from the internal cavities. Broadband noise absorption is provided by the elastic material used to form these parts.

Fan 26 is a standard item that is available in several sizes and with many varied capacities and characteristics. Noise spectra from these fans is also quite variable. Thus, material selection for the absorptive components, 28, 30 and 24 should be made with regard to the noise characteristics of the specific fan 26 selected.

The ring 32 is of sufficient diameter to provide a continuous rim clear of the fan 26 to allow mounting of the inlet bell 24 as seen in FIG. 4. The thickness of the ring 32 should be sufficient to allow the bottom of the guard 34 to be flush with the bottom of the ring 32. Since the bell 24 is elastic, the spokes of the guard 34 may extend below the ring 32 with little difficulty.

Just as with the exhaust components 28 and 30, the inlet bell 24 is formed from an elastic material selected to provide appropriate broadband noise absorption. Inlet bell 24 has a semi-circular shape which gently directs the air stream into the fan 26 with minimum turbulence. Serrations 46 are formed in the top lip of the bell 24 which serve to hold the filtration material 38 in place when the lip is snapped over the rim of the ring 32.

Only two different materials need to be used in the manufacture of the invention's non-standard components 12, 28, 30, 32 and 24. These are a reinforced plastic material for the pedestal 10 and ring 32; and an elastic material for the nozzle 28, cone 30, and bell 24. The elastic parts 28, 30 and 24 are small, symmetrical, and have relatively simple shapes. The plastic pieces 10 and 32 require only two-part molding equipment.

Noise reduction is accomplished in two stages: First, noise generation is reduced by all available means. Second, several means are applied to attenuate any noise generated. The fans 26 are the primary source of generated noise. Noise occurs as the blades shear the airstream. An increase in the rotational speed and/or number of blades will increase the central frequency of the generated noise spectrum. An increased pitch or roughness of the blades will increase the amplitude of the noise. Large diameter fans can produce more air flow at lower velocities for a given rotational speed. Thus, the primary means of reducing generated noise is by proper selection of the fans 26. The proper choice is the fan 26 which provides the desired air flow at the lowest noise level.

Noise is also generated by the turbulence at sharp edges on the boundaries of the air stream. The physical cause of such turbulence is locally high pressure gradients which delaminate the flow. On the standardized "box" fan 26, the sharp edges at the inlet and exhaust are just such a source of noise. The amplitude of the noises increases with flow velocity. Turbulence in the intake air also increases the noise generated the fan blades. The secondary means of reducing generated noise is therefore to have gradual contours on the surfaces surrounding the flow especially where flow velocities are locally high. Flow velocities are high at the exhaust where the nozzle 28 and cone 30 inject the flow into the enclosure. The curvature of the lip at the outlet to the nozzle 28 also serves to reduce local pressure gradients. Flow velocities are also locally high at the rim of the base of the bell 24. The gradual curvature of this rim is also essential. Care must also be taken at the gap 22 between the pedestal 10 and the enclosure 14. Flow velocities may be high if the height of this gap is small. Proper design will eliminate any sharp edges in this region.

In addition to smoothing the air flow, the elastic components 28, 30 and 24 can provide some broadband sound absorption with the proper choice of materials. However, the primary means of sound absorption is via the existing flooring materials (carpeting). Carpeting is an excellent sound absorber at frequencies above 1,000 Hz. The inlet to the air mover assembly 18 is placed immediately above the carpeting as seen in the drawings. The clearance is the minimum required to prevent excessive flow velocities. Noise from the fans intake propagates directly into the carpeting and laterally into the less absorbent bell 24. Reflected noise is contained by the walls of the pedestal 10. Any noise that escapes through the gap 22 has been reflected into sound absorbent materials several times. The curvature of the pedestal 10 also tends to reflect sound away from the gap 22 and into the bell 24 or the carpeting.

Exhaust noise is not attenuated as effectively as that of the intake. The nozzle 28 and cone 30 provide as large of a shadow to direct acoustical emissions as possible. However, since air flow cannot be overly restricted, a large amount of direct noise propagates upwardly. The cavity inside of the exhaust cone 30 may be employed to form a resonator or resonators. Such a resonator can provide excellent sound attenuation in a very narrow frequency band. Obviously, the proper choice of resonant frequencies will be dictated by the noise characteristics of the specific fan 26 employed in the design. Further attenuation of exhaust noise can only be accomplished through the enclosure design.

I claim:

1. In combination with an electronic enclosure having a lower end, comprising,
    a pedestal designed to be positioned between the bottom of the enclosure and a supporting surface,
    said pedestal comprising an outer perimeter wall having a lower end in engagement with the supporting surface and an upper end positioned thereabove and spaced from the lower end of the enclosure to define a gap therebetween,
    at least one air moving device positioned within said outer perimeter wall and having an upper air exhaust end and a lower air intake end,
    the lower air intake end of said air moving device being positioned below the upper end of said perimeter wall and positioned above the supporting surface,
    said air moving device including a fan means which draws air inwardly through said lower air inlet end and discharges the same upwardly from said upper air exhaust end into the lower end of the enclosure,
    said lower air inlet end and said perimeter wall having configurations such that inlet air enters said pedestal through said gap then passes downwardly and outwardly with respect to lower air intake end, thence inwardly and upwardly through said air moving device.
2. The combination of claim 1 wherein said lower air intake end is bell shaped.
3. The combination of claim 1 wherein said perimeter wall extends upwardly and inwardly from its lower end to its upper end.
4. The combination of claim 3 wherein said perimeter wall has an upper end portion which extends inwardly and downwardly with respect to said air moving device.
5. The combination of claim 1 wherein an air filtration means is positioned in said lower air intake end.
6. The combination of claim 1 wherein said fan means is positioned between the upper and lower ends of said air moving means.
7. The combination of claim 1 wherein said upper air exhaust end comprises a substantially ring-shaped exhaust nozzle having an exhaust cone centrally positioned therein.
8. The combination of claim 7 wherein said exhaust nozzle and said exhaust cone are formed of sound absorptive materials.
9. The combination of claim 7 wherein said ring-shaped exhaust nozzle has an upper end which includes an upwardly and outward extending lip.
10. The combination of claim 1 wherein the relationship of said supporting surface, lower air intake end and said perimeter wall is such that noise from said fan means is directed downwardly into said supporting surface for absorption thereby.
11. The combination of claim 1 wherein said outer perimeter wall is comprised of a sound absorption material and extends upwardly and inwardly from its lower end to its upper end.
12. The combination of claim 1 wherein said lower air intake end is substantially bell shaped.

* * * * *